(12) United States Patent
Apodaca et al.

(10) Patent No.: US 10,249,680 B2
(45) Date of Patent: *Apr. 2, 2019

(54) THERMAL MANAGEMENT OF SELECTOR

(71) Applicant: Western Digital Technologies, Inc., San Jose, CA (US)

(72) Inventors: Mac D. Apodaca, San Jose, CA (US); Kurt Allan Rubin, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/874,977

(22) Filed: Jan. 19, 2018

(65) Prior Publication Data

US 2018/0158870 A1  Jun. 7, 2018

Related U.S. Application Data

(63) Continuation of application No. 15/221,407, filed on Jul. 27, 2016, now Pat. No. 9,876,054.

(51) Int. Cl.
*H01L 27/24* (2006.01)
*H01L 45/00* (2006.01)

(52) U.S. Cl.
CPC ...... *H01L 27/2409* (2013.01); *H01L 27/2436* (2013.01); *H01L 45/06* (2013.01); *H01L 45/085* (2013.01); *H01L 45/141* (2013.01)

(58) Field of Classification Search
CPC . H01L 27/2409; H01L 27/2436; H01L 45/06; H01L 45/085; H01L 45/141

USPC .............................................. 257/4; 438/382
See application file for complete search history.

(56) References Cited

U.S. PATENT DOCUMENTS

| | | | |
|---|---|---|---|
| 8,283,648 B2 | 10/2012 | Liu | |
| 8,377,741 B2 | 2/2013 | Savransky et al. | |
| 8,841,644 B2 | 9/2014 | Karpov et al. | |
| 8,890,109 B2 | 11/2014 | Wang et al. | |
| 9,153,777 B2 | 10/2015 | Boniardi et al. | |
| 2004/0125673 A1* | 7/2004 | Daughton | G11C 11/15 365/200 |
| 2006/0278900 A1* | 12/2006 | Chang | H01L 45/04 257/248 |

(Continued)

*Primary Examiner* — Cuong Q Nguyen
*Assistant Examiner* — Tong-Ho Kim
(74) *Attorney, Agent, or Firm* — Patterson & Sheridan, LLP; Steven Versteeg (57) ABSTRACT

A non-volatile memory device that limits the temperature excursion of a selector during operation to enhance the cycling life of the non-volatile memory device. A selector, in line with a memory element, may be degraded with repeated temperature excursions as current passes through a stack during the read/write process. The selector changes from an amorphous state to become crystalline thus reducing the life of a memory device. The memory device includes a word line, a bit line disposed perpendicular to the word line, a stack—including a memory element, a selector, and a spacer—disposed between the word line and bit line, and one or more insulating layers surrounding an outer surface of the stack disposed between the word line and bit line. By surrounding the selector with a high thermal conductive heat-sink material, heat is directed away from the selector helping maintain the selector's amorphous state longer.

20 Claims, 5 Drawing Sheets

(56) References Cited

U.S. PATENT DOCUMENTS

| | | |
|---|---|---|
| 2007/0096162 A1 | 5/2007 | Happ et al. |
| 2009/0140233 A1 | 6/2009 | Kinoshita et al. |
| 2010/0078619 A1* | 4/2010 | Redaelli ............... H01L 27/24 257/3 |
| 2014/0008602 A1* | 1/2014 | Karpov ............... H01L 45/06 257/4 |
| 2014/0353568 A1 | 12/2014 | Boniardi et al. |
| 2015/0097187 A1 | 4/2015 | Govoreanu et al. |

* cited by examiner

THERMAL MANAGEMENT OF SELECTOR

CROSS-REFERENCE TO RELATED APPLICATIONS

This application is a continuation of co-pending U.S. patent application Ser. No. 15/221,407, filed Jul. 27, 2016, which is herein incorporated by reference.

BACKGROUND OF THE DISCLOSURE

Field of the Disclosure

Embodiments of the present disclosure generally relate to a selector structure for non-volatile memory.

Description of the Related Art

The heart of a computer is a magnetic recording device which typically may include a rotating magnetic media or a solid state media device. A number of different memory technologies exist today for storing information for use in a computing system. These different memory technologies may, in general, be split into two major categories: volatile memory and non-volatile memory. Volatile memory may generally refer to types of computer memory that requires power to retain stored data. Non-volatile memory, on the other hand, may generally refer to types of computer memory that do not require power in order to retain stored data. Examples of non-volatile memory may include read-only memory (ROM), phase change random access memory (PCRAM), resistive random access memory (ReRAM), magnetoresistive RAM (MRAM), and flash memory, such as NOR and NAND flash, etc.

Resistive variable memory includes memory cells that can store data on the resistance state of a storage element and thus can be programmed to store data by carrying the resistance level of the storage element. The stored data may be programmed to one of two data states, 1 or 0, depending on whether the memory cell is programmed to a resistance above or below a particular level. Resistive variable memory cells can include a selector device or switch coupled in series with the storage element. The selector is built with a single phase, generally amorphous, with two distinct regions of operation associated to different resistivities. As current passes thru the selector, the selector gets heated according to the power dissipated, I2R. Over time, repeated temperature excursions causes degradation such as crystallization, elemental or multi-element segregation, or material change of the selector and degradation of the non-volatile memory device.

Thus, what is needed is an improved selector in a non-volatile memory device.

SUMMARY OF THE DISCLOSURE

The present disclosure generally relates to a non-volatile memory device that limits the temperature excursion of a selector during operation to enhance the cycling life of the non-volatile memory device. A selector, in line with a memory element, may be degraded with repeated temperature excursions as current passes through a stack during the read/write process. The selector changes from an amorphous state to become crystalline thus reducing the life of a non-volatile memory device. The memory device includes a word line, a bit line disposed perpendicular to the word line, a stack—including a memory element, a selector, and a spacer—disposed between the word line and bit line, and one or more insulating layers surrounding an outer surface of the stack disposed between the word line and the bit line. By surrounding the selector with a high thermal conductive heat-sink material, heat is directed away from the selector helping maintain the selector's amorphous state longer.

In one embodiment, a non-volatile memory device is disclosed. The non-volatile memory device includes a word line, a bit line disposed perpendicular to the word line, and a stack disposed between the word line and the bit line. The stack includes a memory element, a selector, and a spacer layer disposed between the memory element and the selector. The non-volatile memory device further includes one or more insulating layers surrounding an outer surface of the stack disposed between the word line and the bit line.

In another embodiment, a non-volatile memory device is disclosed. The non-volatile memory device includes a word line, a bit line disposed perpendicular to the word line, and a stack disposed between the word line and the bit line. The stack includes a memory element, a selector, and a spacer layer disposed between the memory element and the selector. The selector includes one or more sub-selector layers and one or more heat-sink layers disposed between the one or more sub-selector layers. The non-volatile memory device further includes one or more insulating layers surrounding an outer surface of the stack disposed between the word line and the bit line.

In another embodiment, a memory array is disclosed. The memory array includes a first word line, a first bit line disposed perpendicular to the first word line, a second word line parallel to the first word line, a first stack disposed between the first word line and the first bit line. The first stack includes a first memory element, a first selector, and a first spacer layer disposed between the first memory element and the first selector. The memory array further includes a first insulating layer surrounding an outer surface of the first stack disposed between the first word line and the first bit line and a second stack disposed between the second word line and the first bit line. The second stack includes a second memory element, a second selector, and a second spacer layer disposed between the second memory element and the second selector. The memory array further includes a second insulating layer surrounding an outer surface of the second stack disposed between the second word line and the first bit line.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure relates to a non-volatile memory device that limits the temperature excursion of a selector during operation to enhance the cycling life of the non-volatile memory device. A selector, in line with a memory element, may comprise degraded with repeated temperature excursions as current passes through a stack during the read/write process. The selector changes from an amorphous state to become crystalline thus reducing the life of a non-volatile memory device. The memory device includes a word line, a bit line disposed perpendicular to the word line, a stack—including a memory element, a selector, and a spacer—disposed between the word line and bit line, and one or more insulating layers surrounding an outer surface of the stack disposed between the word line and the bit line. By surrounding the selector with a high thermal conductive heat-sink material, heat is directed away from the selector helping maintain the selector's amorphous state longer.

Figure 1A:
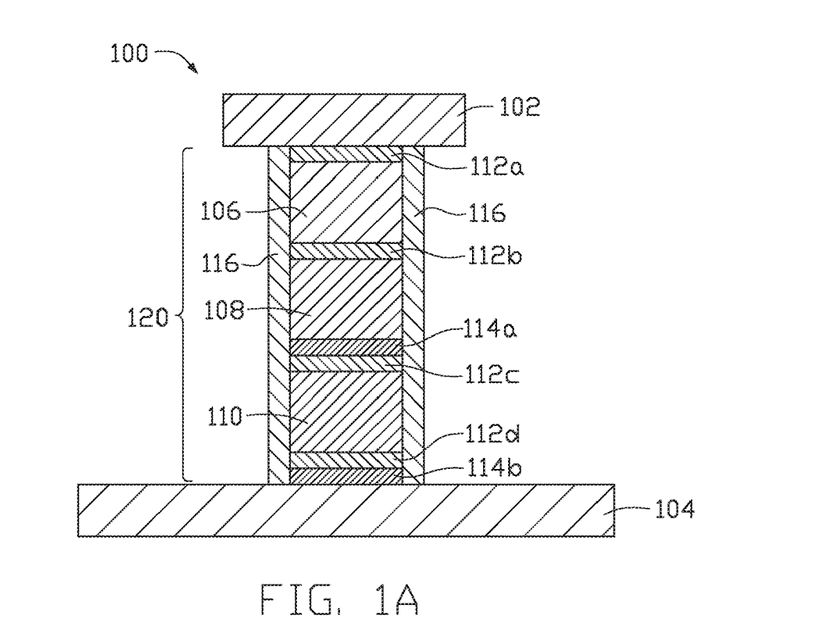
FIG. 1A is a schematic illustration of a cross-section of a memory device according to one embodiment.

FIG. 1A is a schematic illustration of a cross-section of a memory device 100 according to one embodiment. The memory device 100 has a word line 102, a bit line 104, a stack 120, and an insulating layer 116. The word line 102 is disposed in a different plane from the bit line 104 and extends perpendicular to the bit line 104. The stack 120 is disposed between word line 102 and the bit line 104. The word line 102 and the bit line 104 may comprise a material selected from the group consisting of copper (Cu), aluminum (Al), and tungsten (W). The word line 102 and the bit line 104 provide for electric current to reach the stack 120 during the reading, writing, or erasing processes.

The stack 120 may include a memory element 106, a spacer 108, a selector 110, and electrode contacts 112a-d. In one embodiment, the electrode contact 112a is between the word line 102 and the memory element 106, the electrode contact 112b is between the memory element 106 and the spacer 108, the electrode 112c is between the spacer 108 and the selector 110, and the electrode 112d is between the selector 110 and the bit line 104. In another embodiment, the stack 120 may also include a barrier 114a-b. The barrier 114a is disposed between the spacer 108 and the electrode 112c and the barrier 114b is disposed between the electrode 112d and the bit line 104. The barriers 114a-b prevent unwanted atom motion via electromigration within the stack 120. In another embodiment, the electrode 112d is disposed between the word line 102 and selector 110, the electrode 112c is disposed between the selector 110 and the spacer 108, the electrode 112b is disposed between the spacer 108 and the memory element 106, and the contact 112a is disposed between the memory element 106 and the bit line 104. The stack 120 may also include the barrier 114b—disposed between the word line 102 and the electrode 112d—and the barrier 114a disposed between the contact 112c and the spacer 108. The barrier 114a-b is an electromigration barrier and electrical conductor and may include for example, the material cobalt.

The memory element 106 may comprise a phase change memory (PCM)—including chalcogenide alloys such as Germanium-Antimony-Tellurium (GST) material, resistive random access memory (RRAM), magnetoresistive random-access memory (MRAM), or other temperature-generating memory elements. The spacer 108, separating the memory element 106 from the selector 110, may include materials that are an electrical conductor and thermal insulator. The spacer 108 may be one or more the following: titanium nitride (TiN), tantalum nitride (TaN), titanium silicon nitride (TiSiN), titanium aluminum nitride (TiAlN), TeGeSb, Cobalt (Co), Nickel (Ni), and Copper (Cu). The electrode contacts 112a-d may comprise a material selected from the group consisting of Ti, Ta, W, Al, Cr, Zr, Nb, Mo, Hf, B, C, carbon intermixed with other elements, conductive nitrides, and/or combinations thereof.

The selector 110 may comprise a diode or switch and may be selected from the group consisting of an ovonic threshold switch (OTS), a doped-chalcogenide alloys, a thin-film Si, an OTS thin-film selector, an ovonic memory switch (OMS), and a metal/metal-oxide switch. However, embodiments of the present disclosure are not limited to a particular type of selector device and may also include a field effect transistor (FET), a bipolar junction transistor (BJT), or a diode. In one embodiment, the memory device 100 may be fabricated using atomic layer deposition (ALD) or chemical vapor deposition (CVD).

Figure 1B:
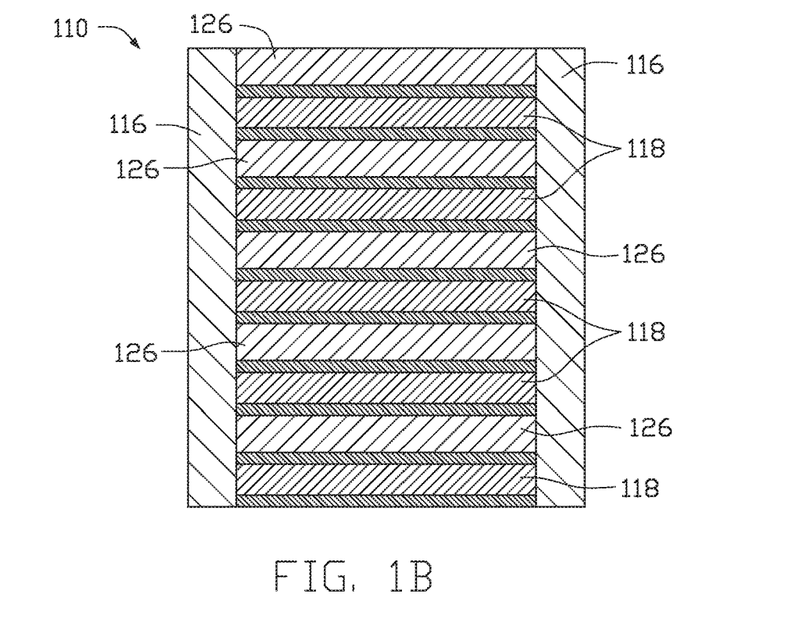
FIG. 1B and FIG. 1C are a schematic illustration of a selector according to one embodiment.
Figure 1C:
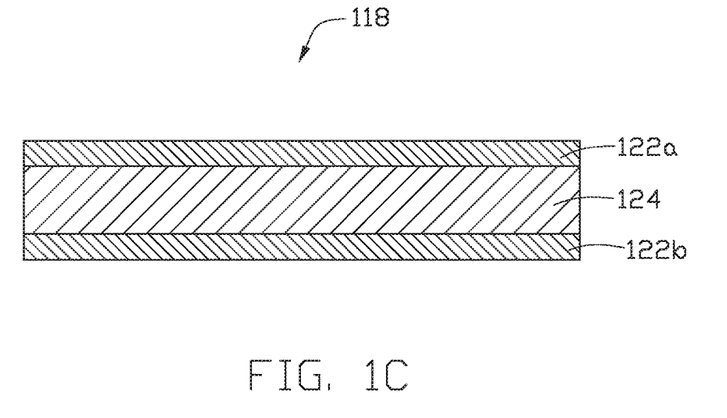

FIG. 1B and FIG. 1C are schematic illustrations of the selector 110 according to one embodiment. The selector 110 may include alternating layers of one or more selector elements 126 and heat-sink layers 118. In one embodiment, the selector 110 includes five layers of selector elements 126 and five layers of heat-sink layers 118. In one embodiment, the heat-sink layers 118 are electrically conducting that transfers the heat away from the selector elements 126 towards the thermal insulating layer 116. The insulating layer 116 may surround the alternating layers of selector elements 126 and heat-sink layers 118. Although five pairs of alternating layers of selector elements 126 and heat-sink layers 118 is shown, more or less layers may be included and the number of selector element layers may be different from the number of heat-sink layers. The alternating layers of selector elements 126 and heat-sink layers 118 advantageously maximizes the surface area in contact with the heat-sink layers 118 thereby reducing the temperature of the stack 120. As illustrated in FIG. 1C, in one embodiment the one or more heat-sink layers 118 may include a heat-sink element 124 between a first electromigration barrier 122a and a second electromigration barrier 122b. In one embodiment, the heat-sink element 124 may comprise copper (Cu)

and the electromigration barriers 122a, 122b may include at least one of the following: cobalt (Co), nickel (Ni), or other alloys.

The insulating layer 116 may comprise a thermal insulator and electrical insulator and may include a material selected from the group consisting of silicon dioxide ($SiO_2$), aluminum oxide ($Al_2O_3$), aluminum nitride (AlN), mixed oxides and nitrides, among others. In one embodiment, the insulating layer 116 is disposed adjacent to the stack 120. In another embodiment, the insulating layer 116 is surrounding an outer surface of the stack 120. The insulating layer 116 may be disposed between the word line 102 and the bit line 104. In another embodiment, the insulating layer 116 surrounds the stack 120 on one or more sides. In yet another embodiment, the insulating layer 116 surrounds the selector 110 on one or more sides. In one embodiment, the insulating layer 116 may provide a heat sink or thermal dissipation region which can reduce the thermal crosstalk between adjacent memory stacks 120. Thermal crosstalk can result in reduced data reliability or data errors as heat is transferred from one memory stack to an adjacent memory stack thereby increasing the temperature of a particular adjacent cell and unintentionally altering the programmed resistance of that adjacent memory element.

Figure 2:
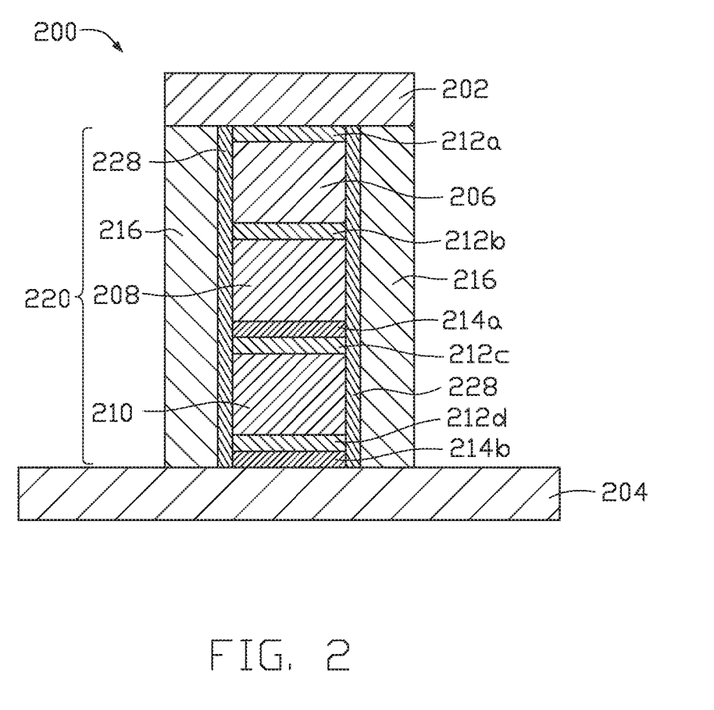
FIG. 2 is a schematic illustration of a memory device according to another embodiment.

FIG. 2 is a schematic illustration of a memory device 200 according to another embodiment. The memory device 200 includes a word line 202, a bit line 204, a stack 220, and a first insulating layer 216, and a second insulating layer 228. The word line 202 is disposed perpendicular to the bit line 204, but in a different plane than the bit line 204. The stack 220 is disposed between word line 202 and the bit line 204. The word line 202 and the bit line 204 may comprise a material selected from the group consisting of copper (Cu), aluminum (Al), and tungsten (W).

The stack 220 may include a memory element 206, a spacer 208, a selector 210, and electrode contacts 212a-d. In one embodiment, the stack 220 may also include a barrier 214a-b. The stack 220 may be substantially similar to the stack 120 of FIG. 1A. In another embodiment, the first insulating layer 216 surrounds the second insulating layer 228. The second insulating layer 228 may comprise a thermal insulator and electrical insulator and may include a material selected from the group consisting of silicon dioxide ($SiO_2$), aluminum oxide ($Al_2O_3$), aluminum nitride (AlN), mixed oxides and nitrides, among others. The first insulating layer 216 may comprise a thermal conductor and electrical insulator and may include a material selected from the group of silicon, beryllium oxide, diamond, silicate, diamond-like carbon and others. In one embodiment, the second insulating layer 228 is disposed adjacent to the stack 220. In another embodiment, the second insulating layer 228 is surrounding the stack 220. The first insulating layer 216 and the second insulating layer 228 may be disposed between the word line 202 and the bit line 204. In yet another embodiment, the second insulating layer 228 surrounds the selector 210 on one or more sides. In one embodiment, the second insulating layer 216 is thinner than the first insulating layer 216. The first insulating layer 216 may comprise a thermal conductor and electrical insulator to provide a heat sink or thermal dissipation region which can reduce the thermal crosstalk between adjacent memory stacks 220. Additionally, by reducing the thermal energy around the selector 210 providing for the selector 210 to maintain an amorphous state longer, the second insulating layer 228 and the first insulating layer 216 extend the life of the memory device 200.

Figure 3A:
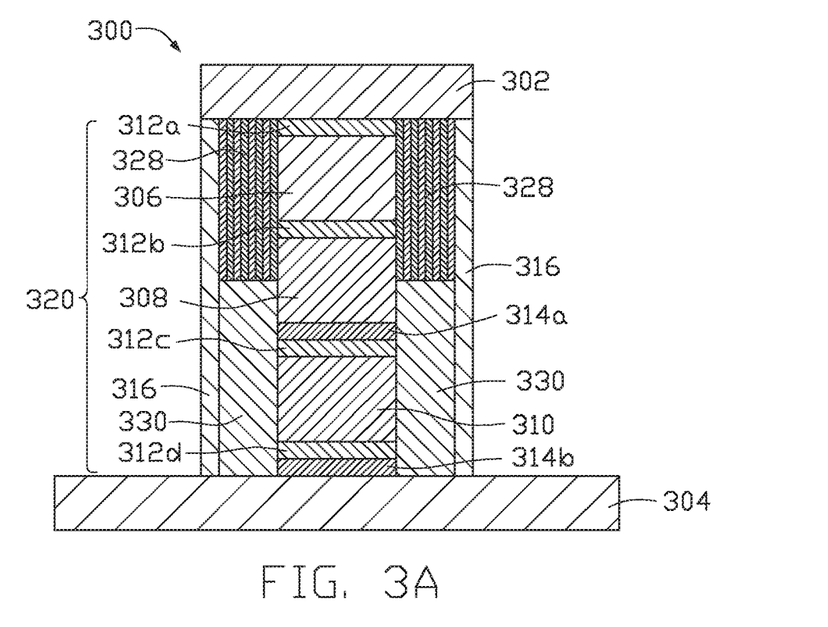
FIGS. 3A-3B are schematic illustrations of a memory device according to yet another embodiment.
Figure 3B:
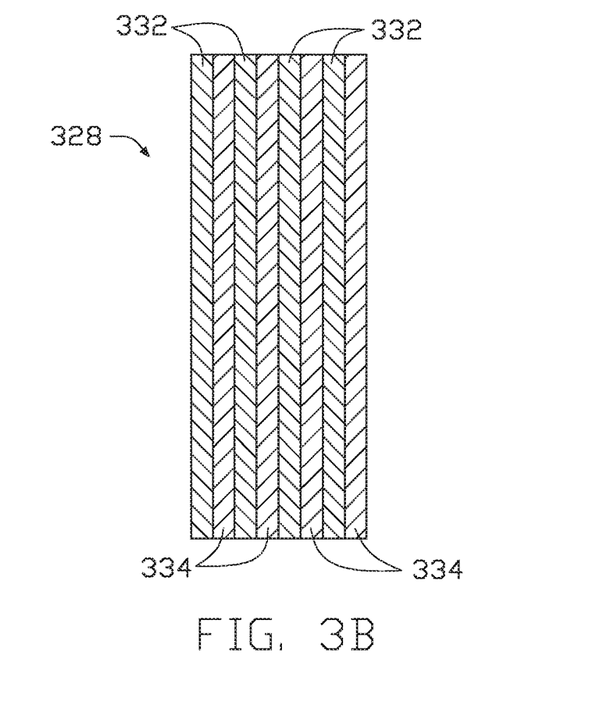

FIGS. 3A and 3B are schematic illustrations of a memory device 300 according to another embodiment. The memory device 300 includes a word line 302, a bit line 304, a stack 320, and a first insulating layer 316, a second insulating layer 328, and a dissipation layer 330. The word line 302 is disposed perpendicular to the bit line 304 but in a different plane therefrom. The stack 320 is disposed between word line 302 and the bit line 304. The word line 302 and the bit line 304 may comprise a material selected from the group consisting of copper (Cu), aluminum (Al), and tungsten (W).

The stack 320 may include a memory element 306, a spacer 208, a selector 310, and electrode contacts 312a-d. In one embodiment, the stack 320 may also include a barrier 314a-b. The stack 320 may be substantially similar to the stack 120 of FIG. 1A. In one embodiment, the first insulating layer 316 surrounds the second insulating layer 328 and the dissipation layer 330. The first insulating layer 316, the second insulating layer 328, and the dissipation layer 330 may be disposed between the word line 302 and the bit line 304. The first insulating layer 316 and the second insulating layer 328 may be a thermal insulator and electrical insulator and may include a material selected from the group consisting of silicon dioxide ($SiO_2$), aluminum oxide ($Al_2O_3$), aluminum nitride (AlN), mixed oxides and nitrides, among others. The dissipation layer 330 may comprise an electrical insulator and heat-sink and may include a material selected from the group of silicon, beryllium oxide, diamond, silicate, and others. The insulating layers may be amorphous or crystalline or may consist of one set of layers which are amorphous and another set which are crystalline. In one embodiment one or more of the layers may contain a low thermal conductivity chalcogenide. In one embodiment, the second insulating layer 328 is disposed adjacent to the memory element 306. In another embodiment, the second insulating layer 328 is surrounding the memory element 306, the first electrode 312a, and the second electrode 312b. The dissipation layer 330 may surround the selector 310 on one or more sides. In one embodiment, the first insulating layer 316 is thinner than the second insulating layer 328. In another embodiment, the first insulating layer 316 is thinner than the dissipation layer 330. The second insulating layer 328 may be adjacent to the dissipation layer 330 and substantially the same width as the dissipation layer 330. In one embodiment, the second insulating layer 328 may be disposed between the word line 302 and the dissipation layer 330.

In one embodiment, the second insulating layer 328 may include alternating layers of dissimilar material as seen in FIG. 3B. The alternating layers of dissimilar material may advantageously increase the thermal resistance of the second insulating layer 328. The second insulating layer 328 may include alternating layers of a first layer 332 and a second layer 334. In one embodiment, the insulating layer may include four pairs of alternating layers of a first layer 332 and a second layer 334. It can be imagined that any number of pairs of a first layer 332 and a second layer 334 may be used. The first layer 332 and the second layer 334 may include the group materials consisting of silicon dioxide ($SiO_2$), aluminum oxide ($Al_2O_3$), aluminum nitride (AlN), mixed oxides and nitrides, among others.

The dissipation layer 330 may be a thermal conductor and electrical insulator to provide a heat sink or thermal dissipation region which can reduce the thermal crosstalk between adjacent memory stacks 320. In one embodiment, the memory device 300 may be fabricated using atomic layer deposition (ALD) or chemical vapor deposition (CVD). In another embodiment, the dissipation layer 330 may be deposited using ALD or CVD then treated with ions using directional RIE before deposition of the insulating layer. Additionally, the combination of the dissipation layer 330 and the first insulating layer 316 and second insulating layer 328 reduces the thermal energy around the selector 310 providing for the selector 310 to maintain an amorphous state longer, thereby extending the life of the memory device 200. Furthermore, the combination of the first insulating layer 316, the second insulating layer 328, and the dissipation layer 330 provide for a faster memory element 306. Memory elements, such as phase change cells, require a large amount of power during the reading and writing processes. The dissipation layer 330 draws heat away from the selector 310 and towards the memory element 306 while the first insulating layer 316 and the second insulating layer 328 maintain heat around the memory element 306. The combination of the three layers, the dissipation layer 330, the first insulating layer 316, and the second insulating layer 328, thus providing for the least of amount of heat required during the read and write processes thereby increasing the efficiency of the memory device 300.

The width of the various layers making up the stack may differ from one another. For instance the width of the layers making up the memory cell may be larger or smaller than the width of the layers making up the selector. In addition, within the memory cell or the selector the width of the layers may vary. The wall angle of the layers may be different from 90 degrees relative to the plane of the layers.

Figure 4A:
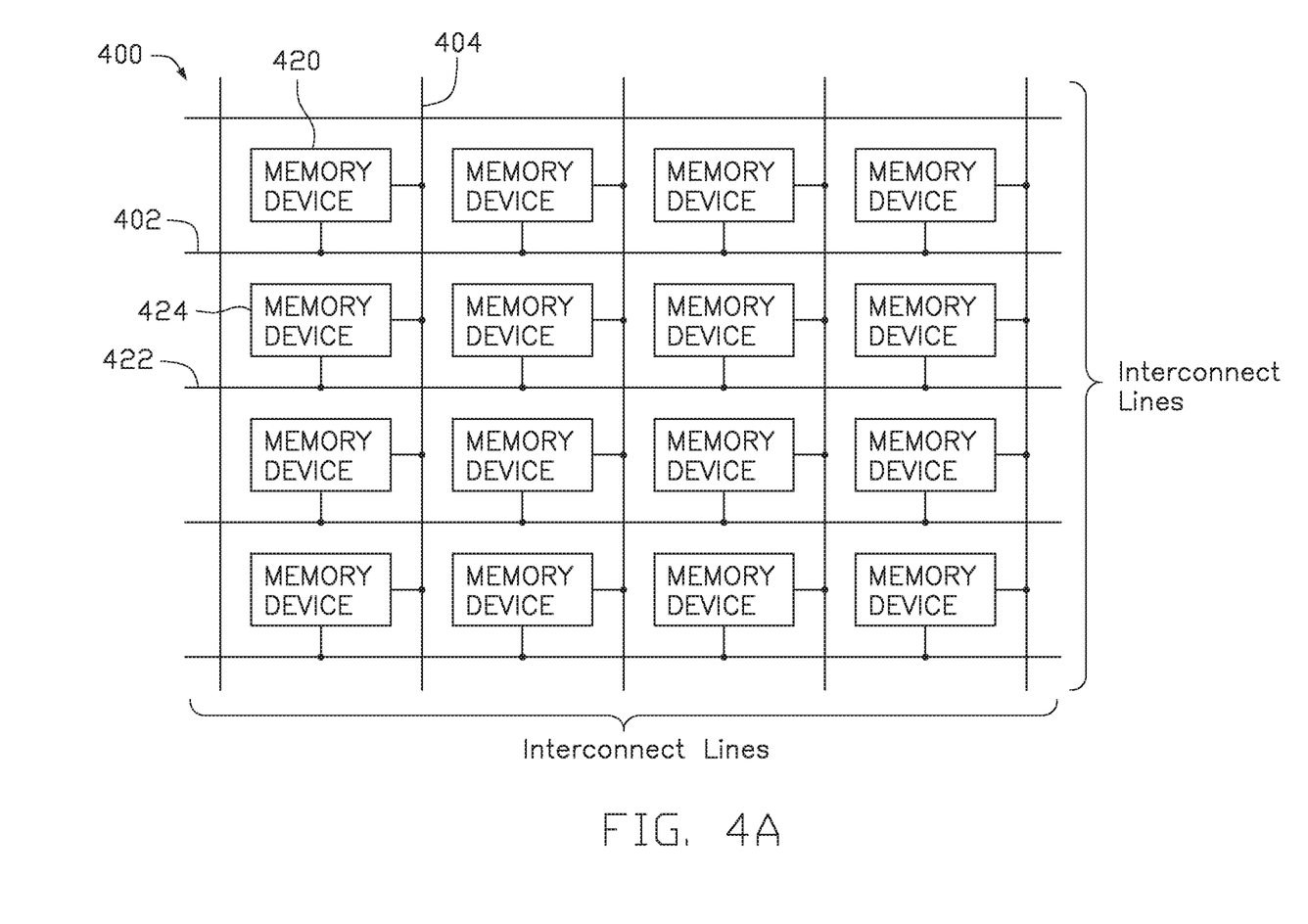
FIGS. 4A-4B are schematic illustrations of a memory array according to one embodiment.
Figure 4B:
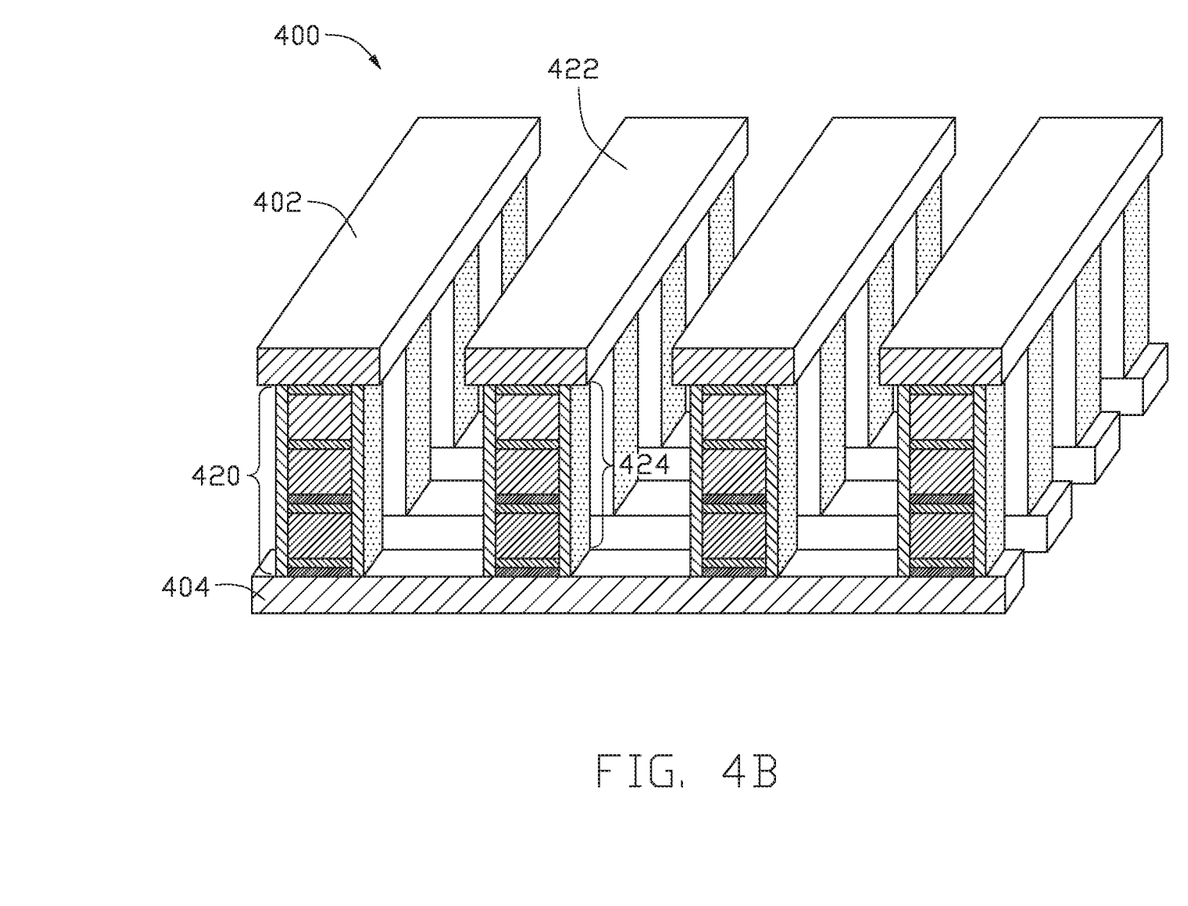

FIG. 4A illustrates a memory array 400, according to one embodiment. The memory array 400 is comprised of a plurality of bottom interconnect lines, a plurality of top interconnect lines disposed perpendicular to the top interconnect lines, and a plurality of stacks disposed in between the plurality of bottom interconnect lines and the plurality of top interconnect lines. According to one example, the memory array 400, as seen in FIG. 4B, includes a first word line 402, a first bit line 404 disposed perpendicular to the first word line 402, a second word line 422 disposed parallel to the first word line 402, a first stack 420. Although not shown, it can be understood that the first stack 420 has a similar disposition to stack 120 of FIG. 1. The first stack 420 is disposed between the first word line 402 and the first bit line 404. The first stack 420 includes a first memory element, a first selector, a first spacer layer disposed between the first memory element and the first selector, one or more electrode contacts, and one or more barrier layers. The memory device also includes a first insulating layer surrounding an outer surface of the first stack 420 disposed between the first word line 402 and the first bit line 404. The insulating layer may be substantially similar to the insulating layer 116 of FIG. 1.

A second stack 424 is disposed between the second word line 422 and the first bit line 404. The second stack 424 includes a second memory element, a second selector, a second spacer layer disposed between the second memory element and the second selector, one or more electrode contacts, and one or more barrier layers. The memory device also includes a second insulating layer surrounding an outer surface of the second stack 424 disposed between the second word line 422 and the first bit line 404. A possible alternative exists where the second insulating layer is different from the first insulating layer. It can be imagined that the second insulating layer may be substantially similar to the insulating layers 216, 228 of FIG. 2. It can be imagined that the memory array 400 may contain a plurality of stacks with one or more insulating layers and one or more dissipation layers. In one embodiment, one or more stacks may share a word line and have individual bit lines. In another embodiment one or more stacks may share a bit line and have individual word lines.

The memory cells disclosed above includes one or more insulating layer that provide a heat sink or thermal dissipation region to reduce the thermal crosstalk between adjacent memory stacks. Thermal crosstalk can result in reduced data reliability or data errors as heat is transferred from one memory stack to an adjacent memory stack thereby increasing the temperature of a particular adjacent cell and unintentionally altering the programmed resistance of adjacent memory devices. Additionally, the present disclosure reduces the thermal energy around the selector providing for the selector to maintain an amorphous state longer, thereby extending the life of the memory device. Furthermore, the present disclosure advantageously maintains the energy surrounding the memory element required during the read and write processes thereby increasing the efficiency of the memory device.

While the foregoing is directed to embodiments of the present disclosure, other and further embodiments of the disclosure may be devised without departing from the basic scope thereof, and the scope thereof is determined by the claims that follow.

What is claimed is:

1. A memory device, comprising:
   a word line;
   a bit line disposed perpendicular to the word line; and
   a stack disposed between the word line and the bit line, wherein the stack comprises:
      a memory element;
      a selector having a plurality of sides, wherein the selector comprises alternating layers of selector elements and heat sinks;
      a spacer layer disposed between the memory element and the selector;
      a first insulating layer disposed between the word line and the bit line;
      a second insulating layer disposed in direct contact with the first insulating layer; and
      a dissipation layer disposed in direct contact with the first insulating layer;
   wherein the dissipation layer is adjacent to the second insulating layer and a same width as the second insulating layer.

2. The memory device of claim 1, wherein the selector further comprises an insulating layer surrounding the alternating layers of selector elements and heat sinks.

3. The memory device of claim 2, wherein the stack further comprises:
   electrode contacts; and
   barriers.

4. The memory device of claim 1, further comprising an insulating layer surrounding the stack.

5. The memory device of claim 1, wherein the heat sinks comprise:
   a first electromigration barrier;
   a heat sink element disposed on the first electromigration barrier; and
   a second electromigration barrier disposed on the heat sink element.

6. The memory device of claim 5, wherein the first electromigration barrier and the second electromigration barrier include at least one of cobalt and nickel.

7. The memory device of claim 1, wherein the selector is selected from the group consisting of an ovonic threshold switch, a doped-chalcogenide alloy, thin film Si, an ovonic threshold switch thin film selector, an ovonic memory switch, a metal/metal-oxide switch, a field effector transistor, a bipolar junction transistor, and a diode.

8. The memory device of claim 1, wherein the memory element is phase change memory.

9. A memory device, comprising:
a word line;
a bit line disposed perpendicular to the word line; and
a stack disposed between the word line and the bit line, wherein the stack comprises:
a memory element;
a selector having a plurality of sides, wherein the selector comprises alternating layers of selector elements and heat sinks; and
a spacer layer disposed between the memory element and the selector, wherein the selector further comprises an insulating layer surrounding the alternating layers of selector elements and heat sinks, wherein the stack further comprises:
electrode contacts; and
barriers, wherein the stack comprises:
a first barrier of the barriers disposed on the bit line;
a first electrode contact of the electrode contacts disposed on the first barrier;
the selector disposed on the first electrode contact;
a second electrode contact of the electrode contacts disposed on the selector; and
a second barrier of the barriers disposed on the second electrode contact.

10. The memory device of claim 9, where the stack further comprises:
the spacer layer disposed on the second barrier;
a third electrode contact of the electrode contacts disposed on the spacer layer;
the memory element disposed on the third electrode contact; and
a fourth electrode contact of the electrode contacts disposed on the memory element.

11. The memory device of claim 10, wherein the word line is disposed on the fourth electrode contact.

12. The memory device of claim 11, further comprising an insulating layer surrounding the stack.

13. The memory device of claim 12, wherein the heat sinks comprise:
a first electromigration barrier;
a heat sink element disposed on the first electromigration barrier; and
a second electromigration barrier disposed on the heat sink element.

14. The memory device of claim 13, wherein the first electromigration barrier and the second electromigration barrier include at least one of cobalt and nickel.

15. The memory device of claim 14, wherein the memory element is phase change memory.

16. A memory device, comprising:
a word line;
a bit line disposed perpendicular to the word line; and
a stack disposed between the word line and the bit line, wherein the stack comprises:
a memory element;
a selector having a plurality of sides, wherein the selector comprises alternating layers of selector elements and heat sinks; and
a spacer layer disposed between the memory element and the selector, wherein the stack comprises:
a first barrier disposed on the bit line;
a first electrode contact disposed on the first barrier;
the selector disposed on the first electrode contact;
a second electrode contact disposed on the selector; and
a second barrier disposed on the second electrode contact.

17. The memory device of claim 16, where the stack further comprises:
the spacer layer disposed on the second barrier;
a third electrode contact disposed on the spacer layer;
the memory element disposed on the third electrode contact; and
a fourth electrode contact disposed on the memory element.

18. The memory device of claim 17, wherein the word line is disposed on the fourth electrode contact.

19. A memory device, comprising:
a word line;
a bit line disposed perpendicular to the word line; and
a stack disposed between the word line and the bit line, wherein the stack comprises:
a first insulating layer disposed between the word line and the bit line;
a second insulating layer disposed in direct contact with the first insulating layer; and
a dissipation layer disposed in direct contact with the first insulating layer;
wherein the dissipation layer is adjacent to the second insulating layer and a same width as the second insulating layer;
a selector element; and
means to direct heat away from the selector.

20. The memory device of claim 19, further comprising means to prevent electromigration.

* * * * *